United States Patent
Wang et al.

(10) Patent No.: US 7,808,871 B2
(45) Date of Patent: Oct. 5, 2010

(54) POWER CONTROL APPARATUS AND METHOD FOR AN OPTICAL DRIVE

(75) Inventors: Hsin Po Wang, Tao Yuan (TW); Lu Chia Tseng, Hsin Chu County (TW); Shu Ming Chang, Tai Pei (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 590 days.

(21) Appl. No.: 11/700,016

(22) Filed: Jan. 31, 2007

(65) Prior Publication Data

US 2007/0217299 A1    Sep. 20, 2007

(30) Foreign Application Priority Data

Mar. 16, 2006    (TW)    .............................. 95108894 A (51) Int. Cl.
*G11B 7/00* (2006.01)
(52) U.S. Cl. .................... 369/53.26; 369/116
(58) Field of Classification Search .................. None
See application file for complete search history.

(56) References Cited

U.S. PATENT DOCUMENTS

| 2006/0007971 | A1 | 1/2006 | Santo et al. |
| 2006/0146894 | A1* | 7/2006 | Shin ..................... 372/29.015 |
| 2006/0239153 | A1* | 10/2006 | Hsin et al. ............... 369/47.53 |
| 2007/0189345 | A1* | 8/2007 | Ko et al. ................ 372/29.021 |

FOREIGN PATENT DOCUMENTS

CN    1917050(A)    2/2007

* cited by examiner

*Primary Examiner*—Lixi Chow
(74) *Attorney, Agent, or Firm*—Muncy, Geissler, Olds & Lowe, PLLC (57) ABSTRACT

A power control apparatus and method for an optical drive is disclosed. The power control apparatus estimates the temperature rising effect of a laser diode and performs a partial open-loop power control, achieving accurate write power control. Therefore, regarding to a high-speed, high-density optical disk recording medium combined with multi-pulse write waveforms, the invention can also achieve accurate write power control even though the response speed of a front photodiode is much slower than the modulation speed of recording pulses of the laser diode.

8 Claims, 10 Drawing Sheets

POWER CONTROL APPARATUS AND METHOD FOR AN OPTICAL DRIVE

This application claims the benefit of the filing date of Taiwan Application Ser. No. 095108894, filed on Mar. 16, 2006, the content of which is incorporated herein by reference.

BACKGROUND OF THE INVENTION

1. Field of the Invention

The invention relates to a power control apparatus employed in an optical drive, and more particularly, to a power control apparatus and method by estimating the temperature rising effect of a laser diode to perform laser power control.

2. Description of the Related Art

Figure 1:
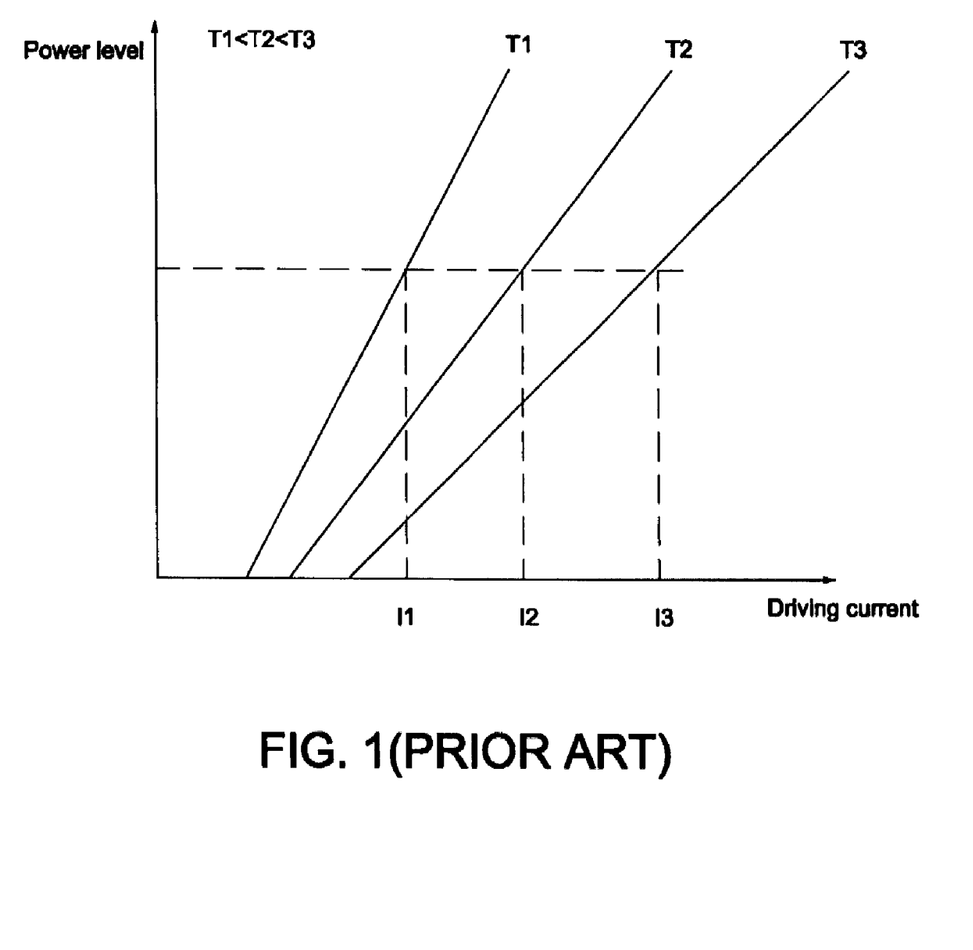
FIG. 1 shows a relation between the laser power and the driving current.

Currently, a laser diode is employed as a light source in a conventional optical drive. In order to keep uniformity in crystallization throughout, the optical disks requires uniformity in laser power. However, as shown in FIG. 1, the optical power output of a laser diode varies greatly with the environmental temperature variations. That is, if the environmental temperature is rising, more current is required to keep the power level of a laser beam identical. If the power level is maintained at a specified value P, at different environmental temperatures, e.g., T3>T2>T1, different driving current levels, e.g., I3>I2>I1, need to be provided. Accordingly, an automatic power controller (APC) is required for the optical drive to stabilize the laser power output of the laser diode.

Figure 2:
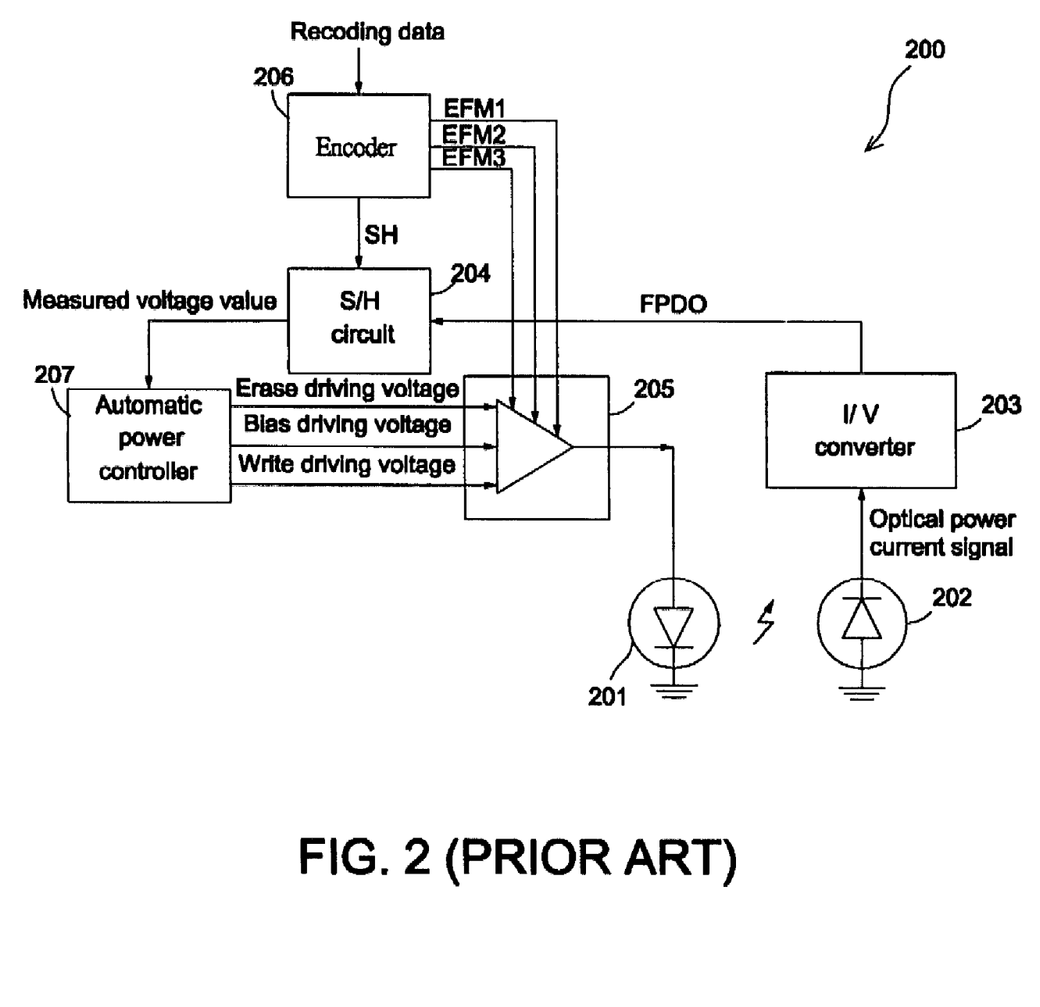
FIG. 2 is a block diagram illustrating a conventional optical drive.

FIG. 2 is a block diagram illustrating a conventional optical drive. In order to correctly measure the optical power output of the laser diode in a conventional optical drive 200, a front photodiode 202 is used to detect the optical power level of a laser diode 201 and then generates an optical power current signal. Next, a current voltage converter 203 converts the optical power current signal into an optical power voltage signal, i.e., a front photodiode output (FPDO) signal. An encoder 206 receives recording data, encodes into three encoded signals EFM1, EFM2, EFM3, and then generates a sample signal SH. During a write mode, an erase mode and a bias mode, a sample and hold circuit 204 performs sample and hold operations to respectively generate measured voltage values VWS, VES, VBS corresponding to the write power level, the erase power level and the bias power level. During the three modes, an automatic power controller 207 respectively compares predetermined reference voltage values VWR, VER, VBR with the measured voltage values VWS, VES, VBS so as to correspondingly generate a write driving voltage VW, an erase driving voltage VE, a bias driving VB, therefore compensating the real laser power level. A laser power driver 205 receives the encoded signals EFM1, EFM2, EFM3, the write driving voltage VW, the erase driving voltage VE, and the bias driving VB and then converts them into currents signals for driving the laser diode 201. Consequently, the laser diode 201 emits laser beams towards a laser disk. Thus, during the above-mentioned three modes, the automatic power control is achieved in the optical drive 200 based on a closed-loop control strategy.

However, the essential perquisite for the closed-loop architecture is that the response speed of the front photodiode 202 must be fast enough to follow after the modulation speed of recording pulses of the laser diode 201; therefore, the optical power level of the laser diode 201 can be feedback correctly. Nevertheless, regarding to high speed or high density optical recording application combined with multi-pulse write waveforms, the response speed of the front photodiode 202 is usually slower than the modulation speed of recording pulses of the laser diode 201. This results in a failure to feedback the correct laser power level for automatic power control.

Figure 3:
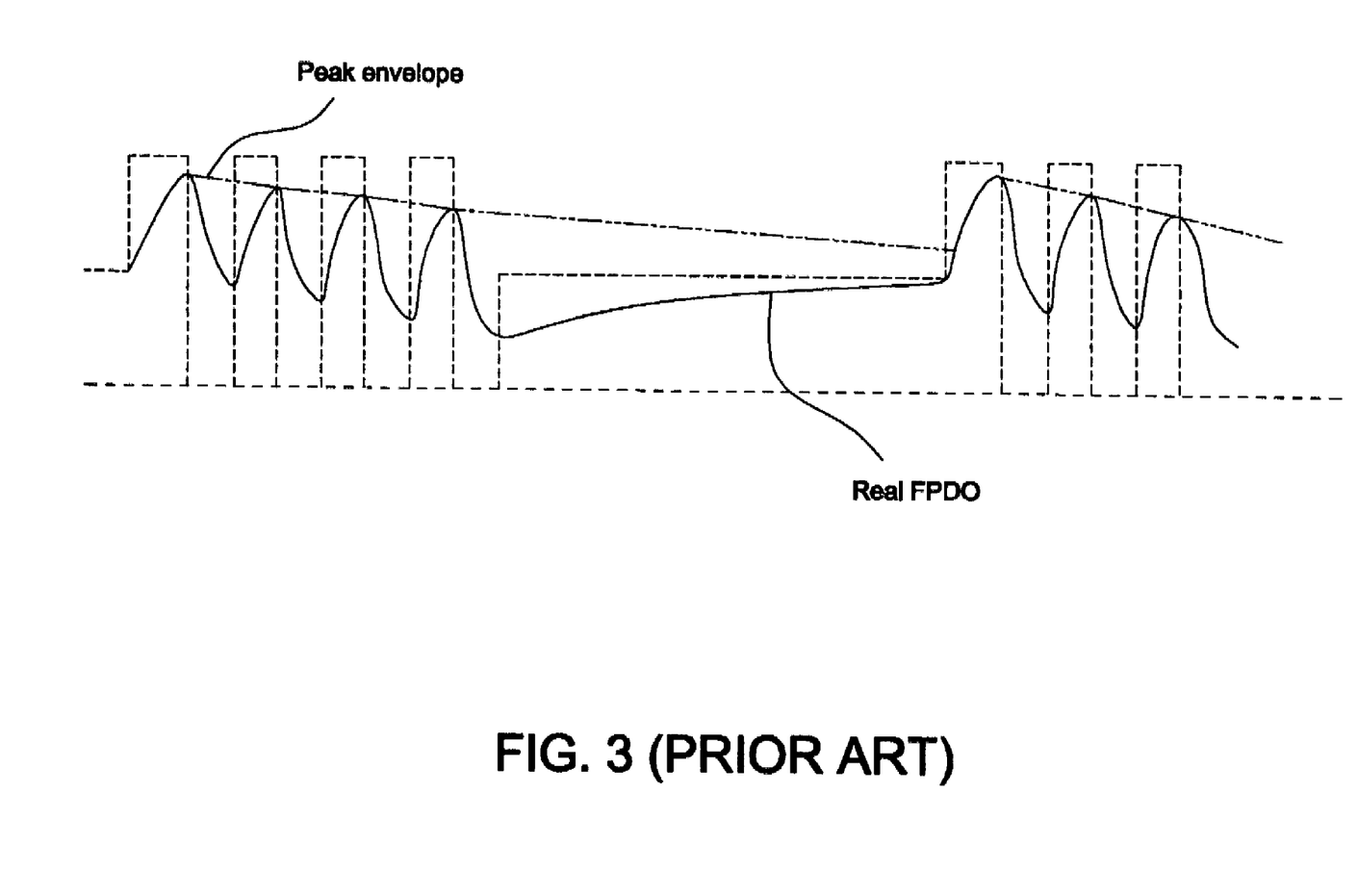
FIG. 3 illustrates a peak envelope waveform during changes in write strategy.

A first conventional solution to this problem is to equip the power feedback path with a peak envelope detection device. The peak envelope detection device continuously tracks the peaks and troughs of the FPDO signal using a peak/bottom hold method for power feedback control, as shown in FIG. 3. However, both the charge time constant and the discharge time constant of the peak envelope detection device needs to be calculated precisely; besides, while the response speed of the front photodiode 202 is much slower than the modulation speed of recording pulses of the laser diode 201, even the peak envelope detection device is not able to detect or reflect the real laser power level.

Figure 4:
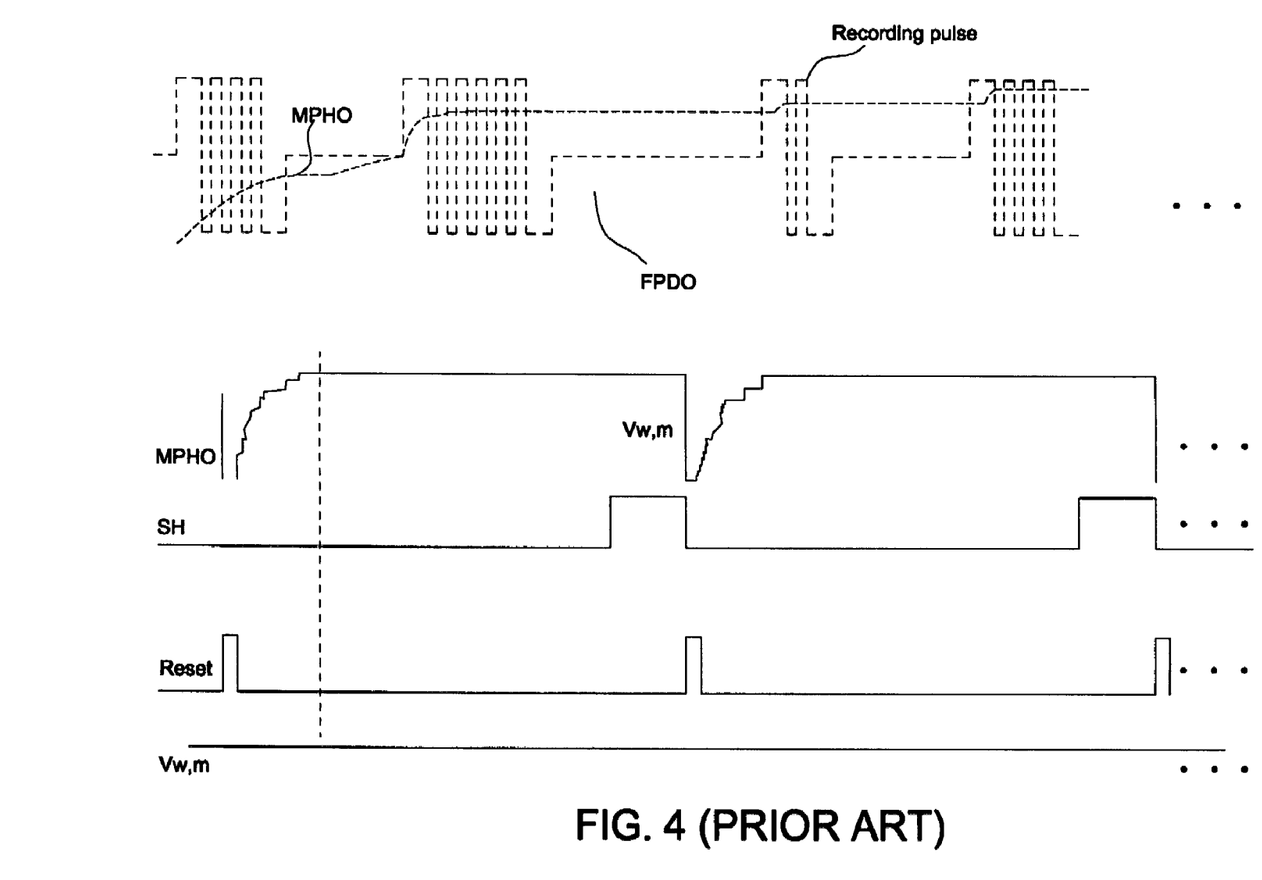
FIG. 4 shows a relation of each signal inside the multi-pulse peak-hold device while a relatively low-speed front photodiode is being used.

A second conventional solution to the above-mentioned problem is to use a method for automatic power control which is disclosed in the U.S. Patent Pub. No. 2005/0025018. A multi-pulse peak-hold device comprises a peak-hold circuit and a sample and hold circuit. FIG. 4 shows a relation of each signal inside the multi-pulse peak-hold device while a relatively low-speed front photodiode is being used. Referring to FIG. 4, the multi-pulse peak-hold device receives the FPDO signal to hold the maximum peak-hold output (MPHO) value of the FPDO signal. Next, the sample and hold circuit 204 samples the MPHO value of the FPDO signal according to the sampling signal SH. Following this, a reset signal is used to reinitialize the peak-hold circuit and therefore the MPHO value is cleared.

However, since the response speed of the front photodiode 202 is not fast enough, the MPHO value may be different from the real laser power level of the laser diode. Thus a power calibration procedure is required for calibrating a ratio of the measured power level to the real power level. The power calibration procedure comprises two steps as follows. Step 1: Measure the voltage level Y1 of the FPDO signal based on recording pulses with a modulation speed slow enough for the MPHO to reflect the real laser power level. Step 2: Measure the voltage level Y2 of the FPDO signal based on normal recording pulses. Finally, in operation, the ratio Y2/Y1 is used to compensate for the difference between the measured power level and the real laser power level.

A third conventional solution to the above-mentioned problem is to use a method for laser power control that is disclosed in the U.S. Patent Pub. No. 2005/0083828. The apparatus performs laser power control using an optional automatic power control area. Generally, due to the much higher channel bit rate, the Blue-ray encounters the above-mentioned problem frequently. Therefore, this method takes a Blue-ray disk as an example. The Blue-ray disk, rewritable format, version 1.0 defines physical data allocation and linking. Wherein, a data recording contains a sequence of recording unit blocks. There are a Run-in area and a Run-out area for each recording unit block. The optional automatic power control area is defined for laser power control in the Run-in area and the Run-out area.

Figure 5:
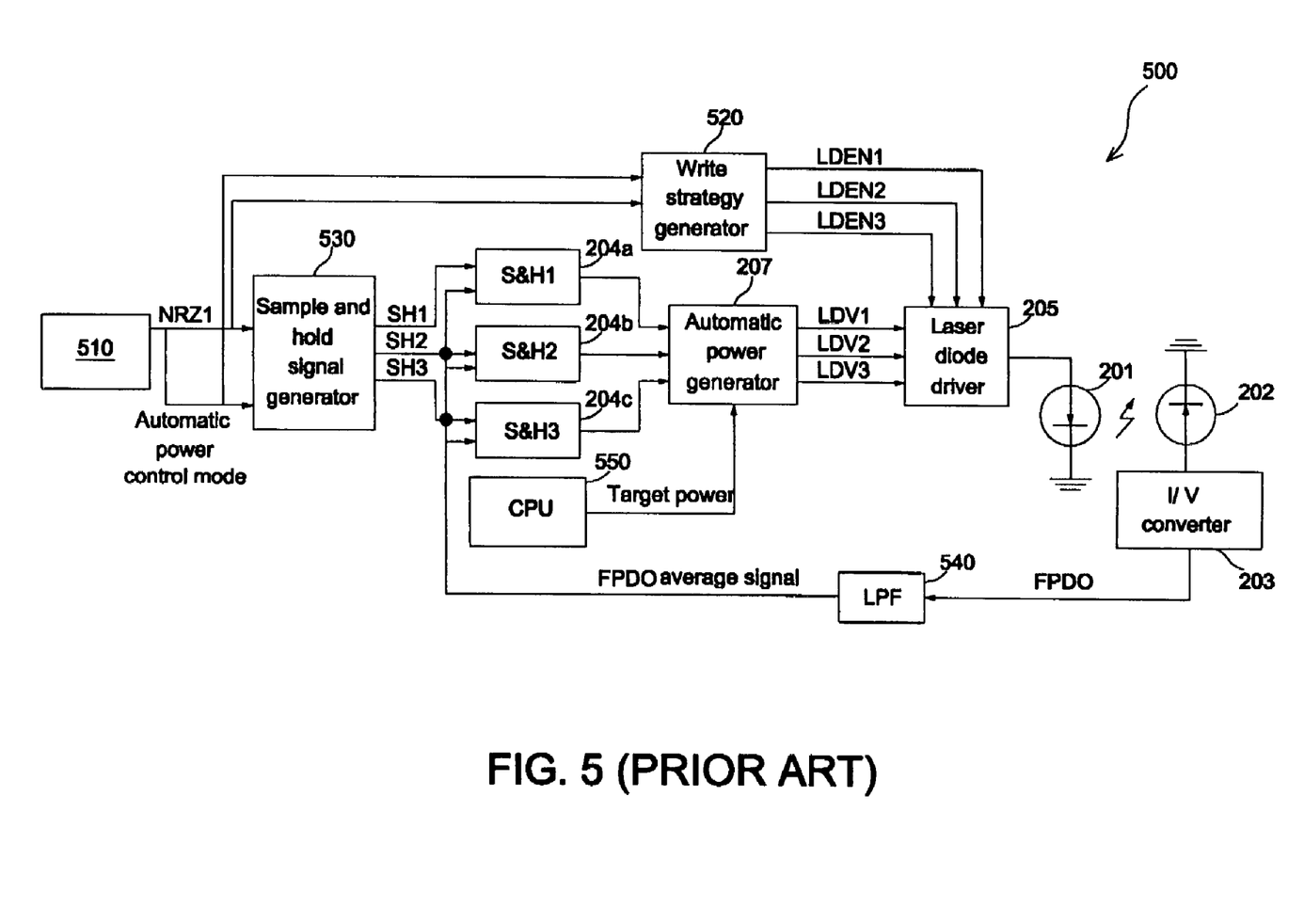
FIG. 5 is a block diagram of another conventional optical drive.

FIG. 5 is a block diagram of another conventional optical drive. An optical drive 500 comprises an encoder/decoder controller 510, a sample and hold signal generator 530, a write strategy generator 520, three sample and hold circuits 204a, 204b, 204c, a CPU 550, an automatic power controller 207, a laser diode 201, a front photodiode 202, a current voltage converter 203 and a low-pass filter 540. According to the relative relationship between the recording speed and the bandwidth of the FPDO signal, the encoder/decoder controller 510 encodes a specific slower non-return to zero inverted (NRZI) signal pattern with a fixed duty ratio and then provides the NRZI signal to the laser power driver 205 for driving the laser diode 201. On the other hand, after receiving the FPDO signal, the low-pass filter 540 generates a FPDO average signal. For example, a fixed duty ratio of 50% would produce an average power level $P_{avg}=P_w/2$. The optical drive 500 also needs a power calibration procedure to obtain a relation of the laser power level to the FPDO signal, just the same as the second conventional solution to the above-mentioned problem. Different duty cycle ratios correspond to different calibration coefficients respectively.

All previously discussed solutions to the above-mentioned problem compensate the power feedback on condition that the response speed of the front photodiode 202 is slower than the modulation speed of recording pulses of the laser diode 201. In fact, as the power level is feedback in the closed-loop automatic power control mode, the result of performing the closed-loop automatic power control may be worse than that of performing an open-loop automatic power control if the compensation does not work well. In addition, each optical pickup head requires an off-line power calibration, so as to increase time and cost of optical-drive manufactures. Thus, the present invention discloses a compensation method different from the conventional solutions.

SUMMARY OF THE INVENTION

In view of the above-mentioned problems, an object of the invention is to provide an optical drive for accurate power control by compensating a driving voltage (or a driving current) related to the write power level according to driving voltage variations generated in a closed-loop.

To achieve the above-mentioned object, the optical drive of the invention comprises: a sample and hold circuit for receiving both a sample hold control signal and an optical power signal, and for generating a measured voltage signal; a closed-loop automatic power controller for receiving both the measured voltage signal and at least one close-loop power command, and for generating at least one closed-loop driving voltage; a command generator for receiving the at least one closed-loop driving voltage of the closed-loop automatic power controller, performing temperature compensation processing and generating a write power command and the at least one close-loop power command; an open-loop power controller for receiving the write power command and generating a write driving voltage; a laser diode driver for receiving at least one encoded signal, the at least one closed-loop driving voltage and the write driving voltage and for generating a laser diode driven signal; a laser diode for receiving the laser diode driven signal and radiating laser light onto an optical disk; and, an optical power detection unit for detecting a laser power of the laser diode and generating the optical power signal.

Another object of the invention is to provide a power control method for an optical drive which comprises the steps of: generating a power reference value at a first temperature according to both a low power driving signal which allows a laser diode to operate at a low power level and a high power driving signal which allows the laser diode to operate at a high power level; controlling the low power driving signal in a closed-loop control mode; and, generating the high power driving signal according to the low power driving signal, the low power level value, the power reference value and the high power driving signal.

A feature of the invention is the use of the temperature rising effect of a laser diode to achieve accurate laser power control even though the response speed of the front photodiode is slower than the modulation speed of recording pulses of the laser diode during high speed/or high density optical recording.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The power control apparatus and method for an optical drive of the invention will be described with reference to the accompanying drawings.

Figure 6A:
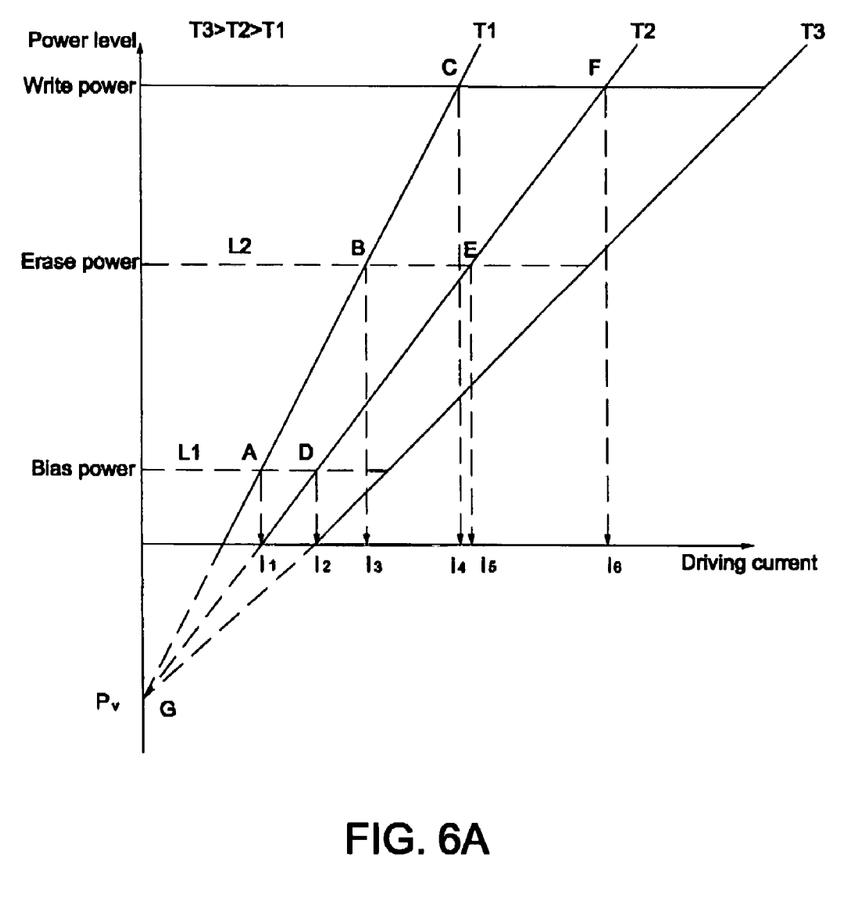
FIG. 6A shows a relation among a laser power level, a driving current and a pseudo power level $P_v$.

FIG. 6A shows a relation among a laser power level, a driving current and a pseudo power level $P_v$.

Referring to 6A, according to the material characteristic, the power level of the laser diode 201 decreases as the temperature rises; consequently, the automatic power controller 207 will increase the driving current to maintain the same power level. Based on this feature, the invention performs closed-loop automatic power control for the bias power (recordable type disks) and the erase power (rewritable type disks). As the temperature of the laser diode 201 rises, in the automatic power control mode (i.e., after the automatic power controller 207 performs power compensation), the driving currents corresponding to both the bias power and the erase power will be also increased to maintain the same power level, i.e., the driving currents moving along L1 and L2 respectively. According to the invention, the driving current corresponding to either the bias power or the erase power is feedback to obtain the increased amplitude of the temperature of the laser diode 201; meanwhile, the increased amplitude of the driving current corresponding to either the bias power or the erase power is also calculated to compensate the driving current corresponding to the write power, achieving an effect of open-loop control similar to an effect of closed-loop control. The invention provides a more reliable control mechanism in comparison with the prior arts which compensate the feedback FPDO signal on condition that the response speed of the front photodiode is slower than the modulation speed of recording pulses of the laser diode.

Figure 6B:
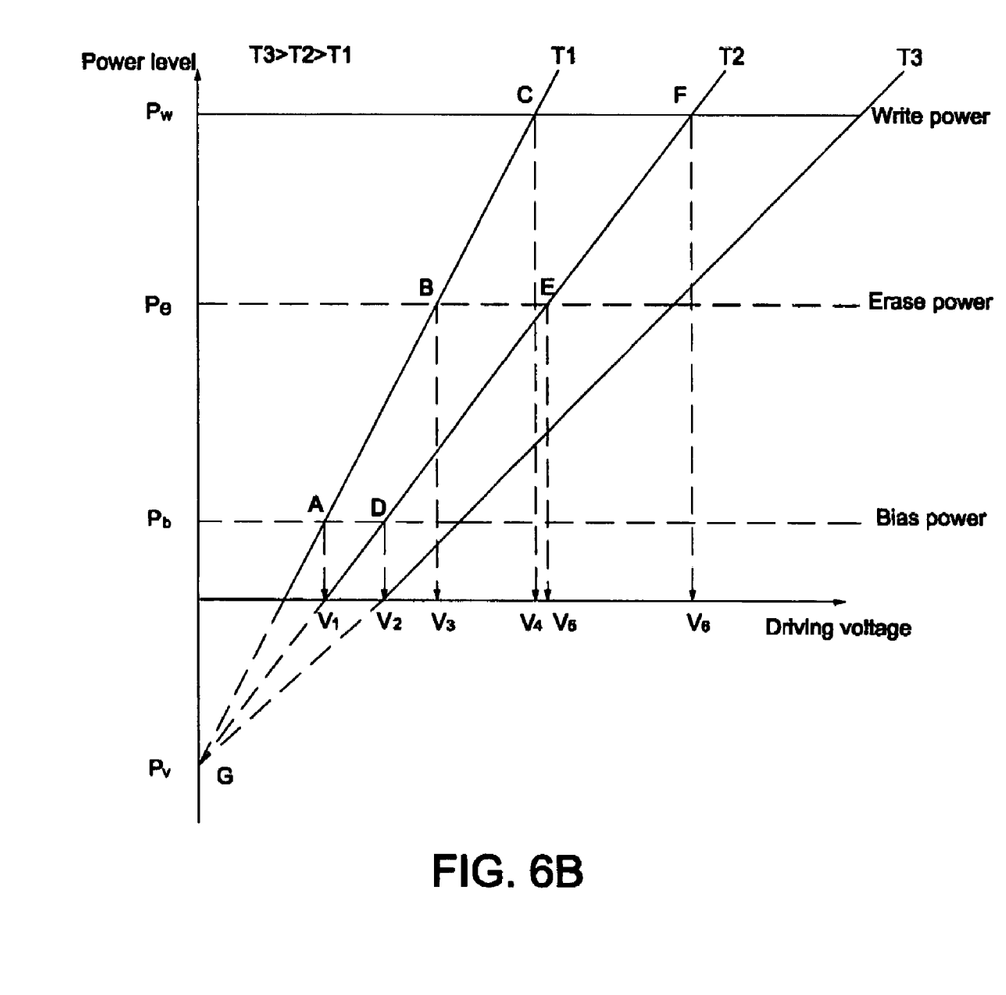
FIG. 6B shows a relation among a laser power level, a driving voltage and a pseudo power level $P_v$.

Note that although the invention is based on the relation between the power level and the driving current as shown in FIG. 6A, in practical application, driving currents is proportionally linear-transformed into driving voltages for implementation as shown in FIG. 6B.

Referring to FIG. 6B, suppose that an optical drive accesses a rewritable disk at an initial temperature T1 and performs erase operations at point B, where the erase driving voltage is equal to $V_3$, in a closed-loop automatic power control mode. Meanwhile, the optical drive performs write operations at point C, where the write driving voltage is equal to $V_4$, in an open-loop automatic power control mode. Given that there is a linear equation of two variables that passes through two points B, C, then the y-intercept, that is the y-coordinate of the point G where the linear equation crosses the y-axis (x is zero), is defined as a pseudo power level $P_y$. Afterwards, the erase power level increases gradually as the temperature rises slowly during operation. Suppose that if the temperature rises up to T2, the erase power level is maintained constant due to the closed-loop automatic power control, but the erase driving voltage increases from $V_3$ to $V_5$. At this time, the write driving voltage $V_6$ corresponding to the point F at the temperature T2 can be derived from two points E, G.

Another way to calculate the write driving voltage $V_6$ is to illustrate different temperature curves by conducting a temperature test which measures the driving voltages corresponding to either the bias power or the erase power at different temperatures; accordingly, the voltage $V_6$ can be derived from the voltage $V_5$. By either of the previously described two ways, the invention can derive the write driving voltage required for the write power level operated in an open-loop mode as the temperature of the laser diode 201 rises, thus achieving accurate power control.

The above-mentioned example describes how the optical drive 700 provides an appropriate write driving voltage after sampling the erase driving voltage in a closed-loop automatic power control mode as the temperature of the laser diode 201 varies. Likewise, in the optical drive 700, the bias driving voltage in a closed-loop automatic power control mode can also be sampled and accordingly an appropriate write driving voltage for a specific write power is provided based on the previously described two ways as the temperature of the laser diode 201 varies. For example, in the closed-loop automatic power control mode, if the temperature rises up to T2, the bias driving voltage for a specific bias power increases from $V_1$ to $V_2$ (from point A to point D). The write driving voltage $V_6$ related to the point F at the temperature T2 can be derived from using either of the previously described two ways. Such a processing mentioned above is defined as a temperature compensation processing in this specification.

Figure 7:
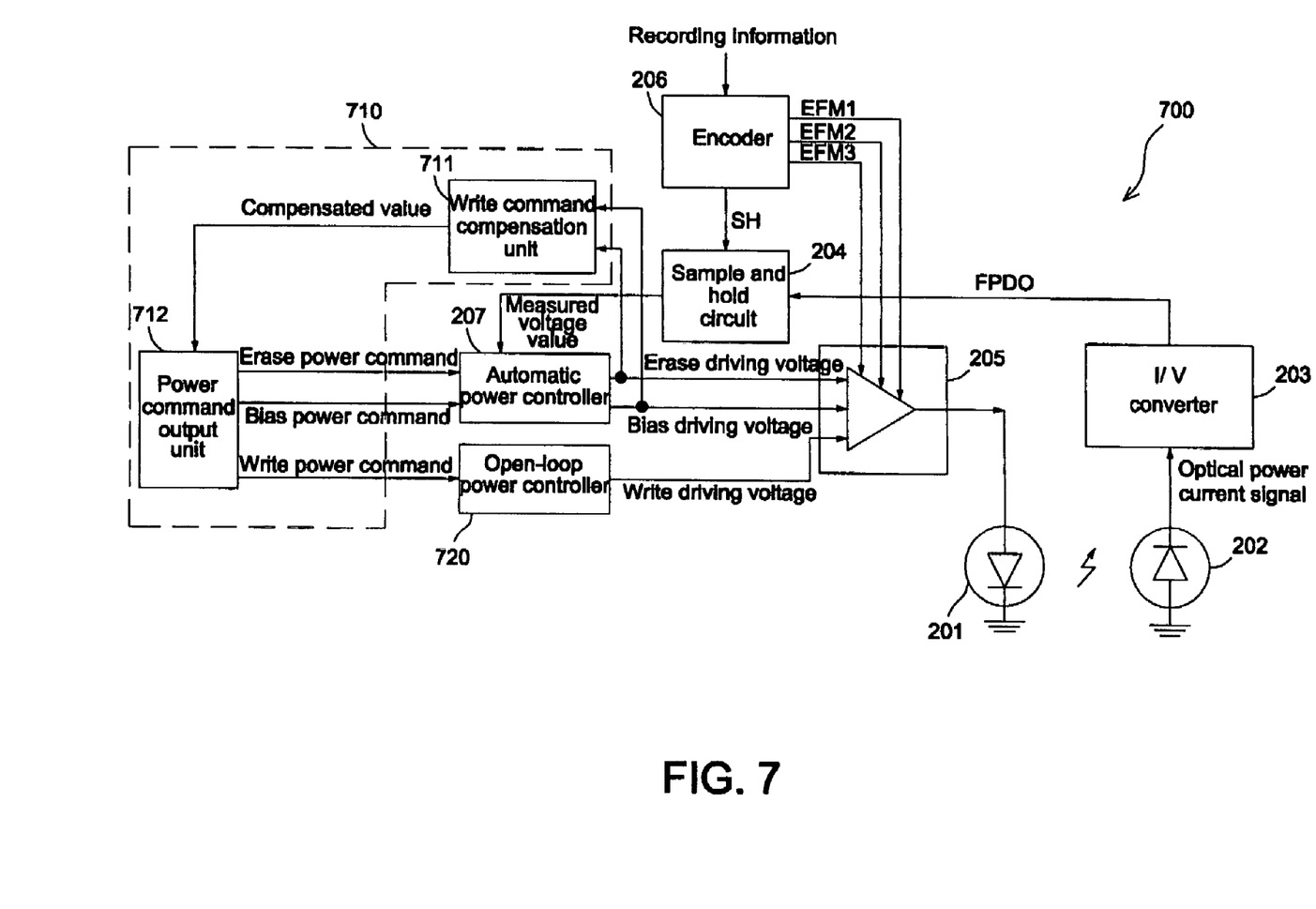
FIG. 7 is a block diagram of an optical drive according to the invention.

FIG. 7 is a block diagram of an optical drive according to the invention. An optical drive 700 comprises a sample and hold circuits 204, an automatic power controller 207, a laser diode 201, a front photodiode 202, a current voltage converter 203, an encoder 206, an open-loop power controller 720 and a command generator 710. Since the components with the same functions have the same numerical symbols for both the optical drive 700 and the optical drive 200 as shown in FIG. 2, the description is omitted here. Compared with the optical drive 200, the optical drive 700 additionally includes two components: the command generator 710 and the open-loop power controller 720. The erase power and the bias power are regulated by performing a closed-loop automatic power control while the write power is adjusted by performing an open-loop automatic power control. According to recording information and write strategy, three encoded signals EFM1, EFM2, EFM3 are encoded by means of the encoder 206, therefore controlling switching timings for different power levels of the laser driver 205. Meanwhile, on condition that the laser driver 205 performs a linear voltage-to-current operation, any of driving voltages generated by the automatic power controller 207 are feedback to the laser driver 205, corresponding to feeding back a driving current. That is, by means of feeding back the bias voltage and the erase voltage to the command generator 710, the write power command is accordingly modified for compensating the temperature-changing effect.

According to the invention, the command generator 710 receives the bias driving voltage or the erase driving voltage (or both) to perform the temperature compensation processing, and calculates a corresponding write power command. Next, the open-loop power controller 720 receives the write power command to generate a corresponding write driving voltage. The command generator 710 comprises a write command compensation unit 711 and a power command output unit 712. The write command compensation unit 711 receives either the bias driving voltage or the erase driving voltage to perform the temperature compensation processing and then generates a compensated value. In the case that the temperature goes up from T1 to T2 (as shown in FIG. 6B), the compensated value can be the slope of line $\overline{EF}$, a write power command corresponding to the write driving voltage $V_6$, or the write driving voltage $V_6$. The power command output unit 712 receives the compensated value and then provides a corresponding write power command to the open-loop power controller 720. If the optical drive 700 records data on a recordable disk, the write command compensation unit 711 samples only the bias driving voltage outputted from the automatic power controller 207; in contrast, the write command compensation unit 711 can sample the bias driving voltage, the erase driving voltage, or both outputted from the automatic power controller 207 if the optical drive 700 records data on a rewritable disk.

Figure 8:
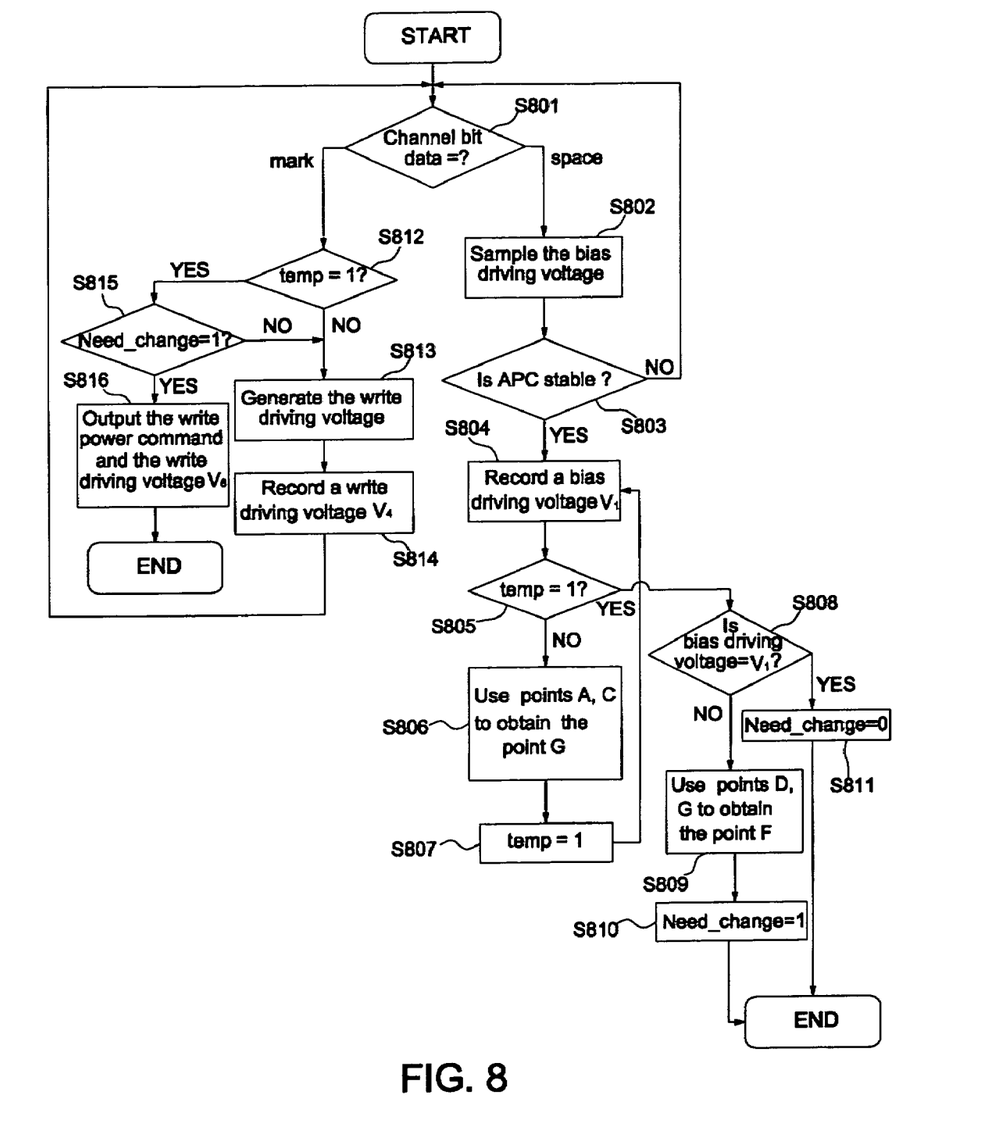
FIG. 8 is a flow chart illustrating a power control method according to a first embodiment of the invention.

FIG. 8 is a flow chart illustrating a power control method according to a first embodiment of the invention. In accordance with FIGS. 6B and 8, while an optical drive is accessing a recordable disk, the power control method is detailed as follows.

At the beginning of writing operations, two flags, both a temp flag and a need_change flag, are set to 0.

Step S801: Determine whether the recording channel bit data in the optical drive 700 are recorded as a space. If "YES", the flow goes to the step S802; otherwise, the flow goes to the step S812.

Step S802: If the recording channel bit data are recorded as a space, the command generator 710 samples a low-power driving voltage (i.e., a bias driving voltage or an erase driving voltage, hereinafter taking the bias driving voltage for instance).

Step S803: After the optical drive 700 is started up, determine whether the current automatic power control for the bias driving voltage is stable. If "YES", the flow goes to the step S804; otherwise, the flow returns to the step S801.

Step S804: At an initial temperature T1, the command generator 710 records an initial bias driving voltage.

Step S805: Determine whether the temp flag is equal to 1. If "YES", the flow goes to the step S808; otherwise, the flow goes to the step S806.

Step S806: Calculate a power reference value. The command generator 710 uses two points $A(V_1,P_b)$, $C(V_4,P_w)$ in the coordinates system where y-axis is the power level axis and x-axis is the driving voltage axis to form a linear equation of two variables, and then calculates an intersection point $G(0, P_v)$ from the linear equation and the power level axis, where $P_{-v}$ is a negative pseudo power value. That is, a first linear equation of the power level and the driving signal is formed based on a low power value (i.e., the bias power value or the erase power value, hereinafter taking the bias driving voltage for instance), a low power driving signal value ($V_1$), a high power value (i.e., the write power value), and a high power driving signal value ($V_4$). According to the first linear equation, the y-intercept, that is the y-coordinate of the point where the graph crosses the power level axis (the driving signal is zero), is obtained as the power reference value $P_v$.

Step S807: The temp flag is set to 1 and the initial temperature power calibration is completed. The flow returns to the step S804.

Step S808: According to the variation in the bias driving voltage, the command generator 710 determines if the temperature of the laser diode 201 varies. If "NO", the flow goes to the step 811; otherwise, the flow goes to the step 809.

Step S809: If the bias driving voltage is equal to $V_2$, it indicates the temperature of the laser diode 201 goes up to $T_2$. The coordinates ($V_6$, $P_w$) of the point F are calculated by using the points $D(V_2, P_b)$ and $G(0, P_v)$.

Step S810: The need_change flag is set to 1. The temperature power calibration after the temperature of the laser diode 201 varies is completed and the flow ends.

Step S811: The need_change flag is set to 0, indicating that the temperature of the laser diode 201 does not vary. Therefore, the flow ends here.

Step S812: While the recording channel bit data are recorded as a mark, determine whether or not the temp flag is equal to 1. If "YES", the flow goes to the step S815; otherwise, the flow goes to the step S813.

Step S813: It indicates that the initial temperature power calibration has not completed. According to the initial write power command, the open-loop power controller 720 generates a write driving voltage $V_4$.

Step S814: The command generator 710 records an initial write driving voltage $V_4$.

Step S815: It indicates that the initial temperature power calibration is completed. Referring to whether the need_change flag is equal to 1, determine if the temperature power calibration after the temperature of the laser diode 201 varies is completed. If "YES", the flow goes to the step S816; otherwise, the flow goes to the step S813.

Step S816: This is a high power (write power) control step. If the temperature power calibration after the temperature of the laser diode 201 varies is completed and the temperature of the laser diode 201 goes up to $T_2$, the command generator 710 outputs a write power command (or a bias power command corresponding to a point D) corresponding to a point F. And, the open-loop power controller 720 generates a write driving voltage $V_6$ (or the automatic power controller 207 generates the bias driving voltage $V_2$). The high power control step comprises the following steps of: sampling the low power driving signal as a low power sampling signal; generating a second linear equation of the power level and the driving signal at a second temperature according to the power reference value, the low power sample driving signal and the low power level value; and, calculating a driving signal value as the high power driving voltage by plugging the high power level value into the second linear equation.

Figure 9:
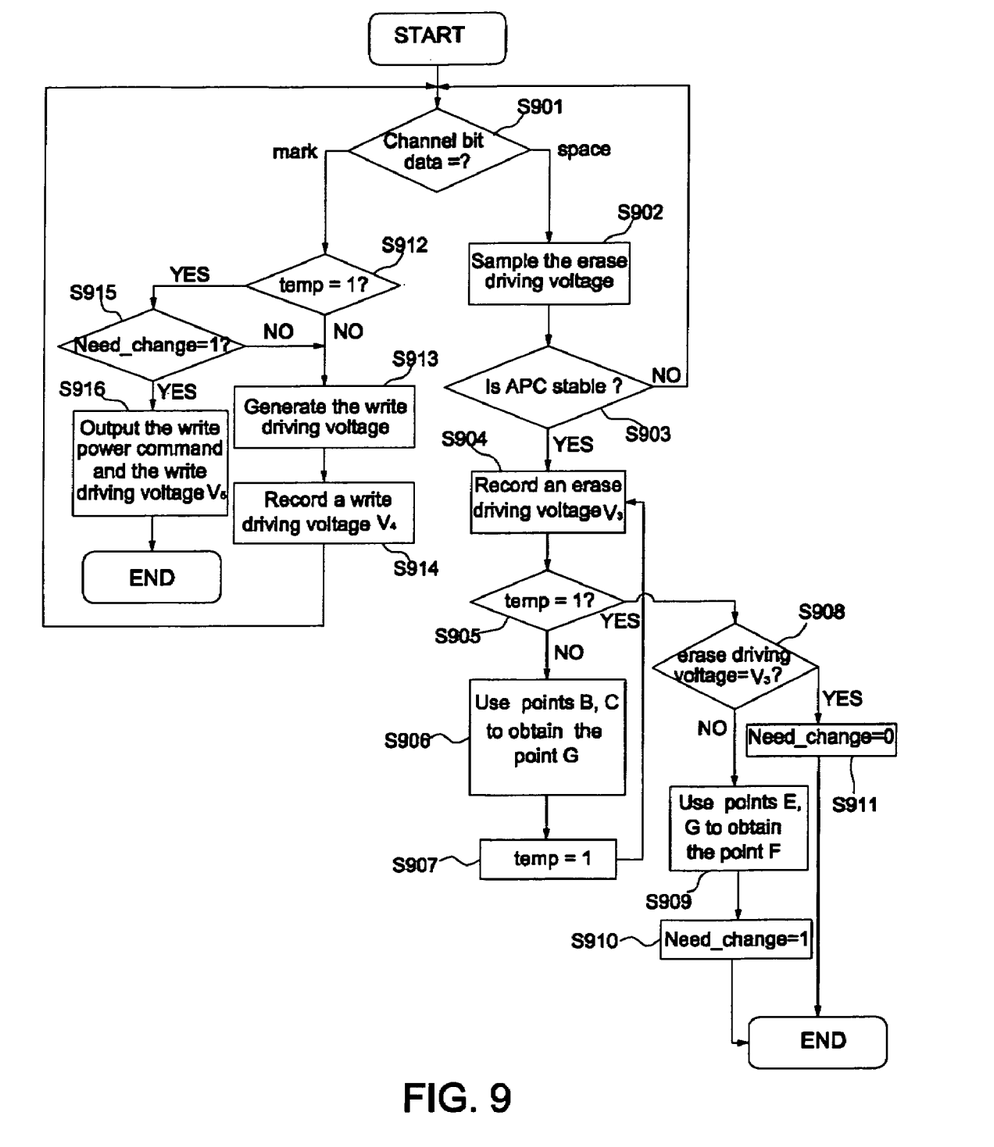
FIG. 9 is a flow chart illustrating a power control method according to a second embodiment of the invention while the optical drive is accessing a rewritable disk.

FIG. 9 is a flow chart illustrating a power control method according to a second embodiment of the invention while the optical drive 700 is accessing a rewritable disk. Since the flow chart of FIG. 8 is similar to that of FIG. 9, the obvious difference in FIG. 9 is that the command generator 710 samples the erase driving voltage as the low power driving voltage in order to monitor the temperature variations of the laser diode. Besides, two points $B(V_3,P_e)$, $C(V_4,P_w)$ in the coordinates system where y-axis is the power level axis and x-axis is the driving voltage axis are used to form a linear equation of two variables, and then an intersection point $G(0, P_v)$ of the linear equation and the power level axis is obtained. Since the rest of the flow of FIG. 8 is the same as that of FIG. 9, the description is omitted herein. Further, while the optical drive 700 accesses a rewritable disk, the bias driving voltage can also be sampled in order to monitor the temperature variations of the laser diode, and a corresponding write driving voltage after the temperature of the laser diode 201 varies is obtained by using the flow of FIG. 8. In addition, both of the bias driving voltage and the erase driving voltage can be sampled simultaneously to monitor the temperature variations of the laser diode; meanwhile, three points $A(V_1,P_b)$, $B(V_3,P_e)$, $C(V_4,P_w)$ are used to form a linear equation of two variables, and then an intersection point $G(0, P_v)$ of the linear equation and the power level axis is calculated. Finally, a corresponding write driving voltage after the temperature of the laser diode 201 varies is obtained using the flow of either FIG. 8 or FIG. 9.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A power control method for an optical drive, the method comprising the steps of:
   controlling a low power driving signal for driving a laser diode to operate at a low power level value and recording a initial value of the low power driving signal at a initial temperature through a closed-loop control mode;
   generating a power reference value at the initial temperature according to the initial value of the low power driving signal and a initial value of a high power driving signal which drives the laser diode to operate at a high power level value, wherein the power reference value is a negative pseudo power value while a current of the laser diode is zero;
   controlling the low power driving signal in a closed-loop control mode at a current temperature to obtain a current value of the low power driving signal; and
   generating the high power driving signal at the current temperature according to the current value of the low power driving signal, the low power level value, the power reference value and the high power level value.

2. The method according to claim 1, wherein the step of generating the power reference value comprises:
   generating a first linear equation of the low power level, the high power level, the low driving signal and the high driving signal according to the low power level value, the low power driving signal value, the high power level value and the high power driving signal value; and calculating a power level value as the power reference value while the driving signal value is equal to zero according to the first linear equation.

3. The method according to claim 1, wherein the low power driving signal is a bias driving voltage.

4. The method according to claim 3, wherein the step of controlling the low power driving signal further comprises:
controlling an erase driving voltage in the closed-loop control mode.

5. The method according to claim 1, wherein the low power driving signal is an erase driving voltage.

6. The method according to claim 5, wherein the step of controlling the low power driving signal further comprises:
controlling a bias driving voltage in the closed-loop control mode.

7. The method according to claim 1, wherein the step of generating the high power driving signal comprises:
sampling the low power driving signal as a low power sample driving signal;
generating a second linear equation of the low power level, the high power level, the low driving signal and the high driving signal at a second temperature according to the power reference value, the low power sample driving signal and the low power level value; and
calculating a driving signal value as the high power driving signal by plugging the high power level value into the second linear equation.

8. The method according to claim 7, wherein the high power driving signal is a write driving voltage.

* * * * *